United States Patent
Goto

(10) Patent No.: US 7,982,242 B2
(45) Date of Patent: Jul. 19, 2011

(54) WARP-FREE SEMICONDUCTOR WAFER, AND DEVICES USING THE SAME

(75) Inventor: Hirokazu Goto, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/437,065

(22) Filed: May 7, 2009

(65) Prior Publication Data

US 2009/0218598 A1 Sep. 3, 2009

Related U.S. Application Data

(62) Division of application No. 11/683,222, filed on Mar. 7, 2007, now abandoned.

(30) Foreign Application Priority Data

Mar. 8, 2006 (JP) .................................. 2006-062653

(51) Int. Cl.
*H01L 29/737* (2006.01)
*H01L 29/778* (2006.01)

(52) U.S. Cl. ................. 257/200; 257/192; 257/E29.248; 257/E29.249; 438/94

(58) Field of Classification Search ............... 257/96, 257/194, 774, E29.246–E29.253, 192, 200; 438/94
See application file for complete search history.

(56) References Cited

U.S. PATENT DOCUMENTS

| 5,145,793 | A | * | 9/1992 | Oohara et al. | 438/94 |
| 5,412,226 | A | | 5/1995 | Rejman-Greene et al. | |
| 6,147,370 | A | * | 11/2000 | Kanamori | 257/192 |
| 7,276,799 | B2 | * | 10/2007 | Lee et al. | 257/777 |

FOREIGN PATENT DOCUMENTS

JP 2005-158889 A 6/2005

* cited by examiner

*Primary Examiner* — Matthew C Landau
*Assistant Examiner* — Jessica Hall
(74) *Attorney, Agent, or Firm* — Woodcock Washburn LLP

(57) ABSTRACT

A semiconductor wafer to be diced into individual SBDs, HEMTs or MESFETs has a substrate with a main semiconductor region and counter semiconductor region formed on its opposite surfaces. The main semiconductor region is configured to provide the desired semiconductor devices. In order to counterbalance the warping effect of the main semiconductor region on the substrate, as well as to enhance the voltage strength of the devices made from the wafer, the counter semiconductor region is made similar in configuration to the main semiconductor region. The main semiconductor region and counter semiconductor region are arranged in bilateral symmetry as viewed in a cross-sectional plane at right angles with the substrate surfaces.

6 Claims, 4 Drawing Sheets

WARP-FREE SEMICONDUCTOR WAFER, AND DEVICES USING THE SAME

CROSS REFERENCE TO RELATED APPLICATIONS

This application is a Divisional of U.S. patent application Ser. No. 11/683,222 filed Mar. 7, 2007, which claims priority to Japanese Patent Application No. 2006-062653, filed Mar. 8, 2006. The disclosures of these patent applications are incorporated herein by reference in their entireties.

BACKGROUND OF THE INVENTION

This invention relates to semiconductors in general and, in particular, to a semiconductor wafer and to semiconductor devices utilizing the same. The invention specifically pertains to field-effect transistors (FETs), Schottky-barrier diodes (SBDs), and high-electron-mobility transistors (HEMTs), among other semiconductor devices.

The metal-semiconductor FET (MESFET) and HEMT have been both known and used extensively which are made from semiconducting nitrides on silicon substrates. Japanese Unexamined Patent Publication No. 2005-158889 is hereby cited as dealing with these kinds of semiconductor devices. One of the problems with such semiconductor devices arose when they were put to use in a "floating" state, that is, with the potential of the silicon substrate left unfixed. The substrate potential of a floating semiconductor device varied with a DC, AC, or high-frequency voltage impressed to the device, making it unreliable in performance.

One known solution to this problem is the back electrode on the back surface, opposite to the surface on which nitride semiconductor layers are grown, of the silicon substrate. The back electrode has its potential fixed by being electrically coupled to a main electrode (anode in the case of an SBD and a source in the case of an FET) on the nitride semiconductor layers. This solution has proved unsatisfactory because the back electrode may invite a drop in the voltage strength of the device.

Let us consider for example an SBD having a back electrode coupled to its anode. Voltage application between anode and cathode of this SBD also results in that between its cathode and back electrode. As a consequence, when the SBD is turned off (reverse biased), a leakage current may flow not only between cathode and anode but also between cathode and back electrode. It is customary in the semiconductor industry to assess the voltage strength of semiconductor devices in terms of current leakage: The greater the current leakage, the lower is the voltage strength assessment. The susceptibility of the back-electroded SBD to greater current leakage has therefore been a bar to the enhancement of its voltage strength.

In SBDs, FETs and other comparable semiconductor devices, a drop in voltage strength has proved to lessen significantly through reduction of current leakage between cathode and back electrode. This objective is attainable by making thicker the nitride semiconductor layers on the silicon substrate.

However, difficulties have been experienced in growing the nitride semiconductor region to a thickness of, say, five micrometers or more on the substrate. The nitride semiconductor region of such thickness has then been easy to crack, and the complete wafer to warp, by reason of a difference in lattice constant or thermal expansion coefficient between the nitride semiconductor region and the substrate. The cracking of wafers is a serious detriment to the manufacturing efficiency of the semiconductor devices. Warping wafers, on the other hand, may become unusable, being incapable, for example, of being correctly mounted to the fabrication machinery. Even if used one way or another, distorted wafers have been very likely to impede the smooth progress of the manufacturing process. Similar difficulties and inconveniences have been encountered not only with nitride semiconductor devices but with those using other III-V compound semiconductors.

SUMMARY OF THE INVENTION

The present invention has it as an object to reduce the warpage of semiconductor wafers of the kind defined, to a minimum.

Another object of the invention is to enhance the voltage strength of the semiconductor devices of the kind defined at the same time with improvement in stability of their electrical performance.

Briefly stated in one aspect thereof, the invention provides a warp-free semiconductor wafer to be diced into individual semiconductor devices such as SBDs, HEMTs, and MESFETs. Included is a substrate made from material consisting essentially of silicon. The substrate has formed on its pair of opposite major surfaces a main semiconductor region of Groups III-V compound semiconductor material and a counter semiconductor region of Groups III-V compound semiconductor material. At least the main semiconductor region is configured to provide any desired one of the listed types of semiconductor devices. Preferably, however, as in most of the embodiments to be disclosed subsequently, the main semiconductor region and counter semiconductor region are of like configuration and like thickness and are arranged in bilateral symmetry as viewed cross-sectionally along a plane normal to the major surfaces of the substrate.

Thus the stress acting between the wafer substrate and the main semiconductor region on one of its major surfaces is counterbalanced by the stress between the wafer substrate and the counter semiconductor region on the other major surface. The result is the minimization of the wafer warpage.

Another aspect of the invention concerns a semiconductor device made from the wafer of the above summarized design. The semiconductor device comprises a substrate made from material consisting essentially of silicon, a main semiconductor region of Groups III-V compound semiconductor material on one major surface of the substrate, and a counter semiconductor region of Groups III-V compound semiconductor material on the other major surface of the substrate. Additionally, there are at least two main electrodes on the main semiconductor region, and a back electrode on the counter semiconductor region. Preferably, the back electrode is electrically coupled to one of the main electrodes.

Employed in combination with the warp-free wafer or substrate of the invention, the back electrode is conducive not only to the stabilization of electrical performance and but to the improvement of voltage strength through reduction of leakage current between the back electrode and one of the main electrodes. Current leakage in this direction is less with the semiconductor device of this invention than with the prior art device having the main semiconductor region of the same thickness as that of the invention but no counter semiconductor region.

The semiconductor device according to the invention is therefore bound to be assessed higher in voltage strength than the prior art. Indeed, if the main semiconductor region and counter semiconductor region are of the same thickness, the voltage strength assessment of the inventive device will be twice as high as that of the prior art. This goal is attained, moreover, with concurrent reduction or elimination of wafer warpage.

Stated conversely, if the semiconductor device according to the invention is to possess approximately the same voltage strength as does the prior art, then the main semiconductor region, as well as the counter semiconductor region, of the inventive device can be made thinner than the corresponding part of the prior art. Such a thin main semiconductor region is less susceptible to cracking and has a less warping effect on the substrate. The wafer will not therefore warp if the counter semiconductor region is made correspondingly thin.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
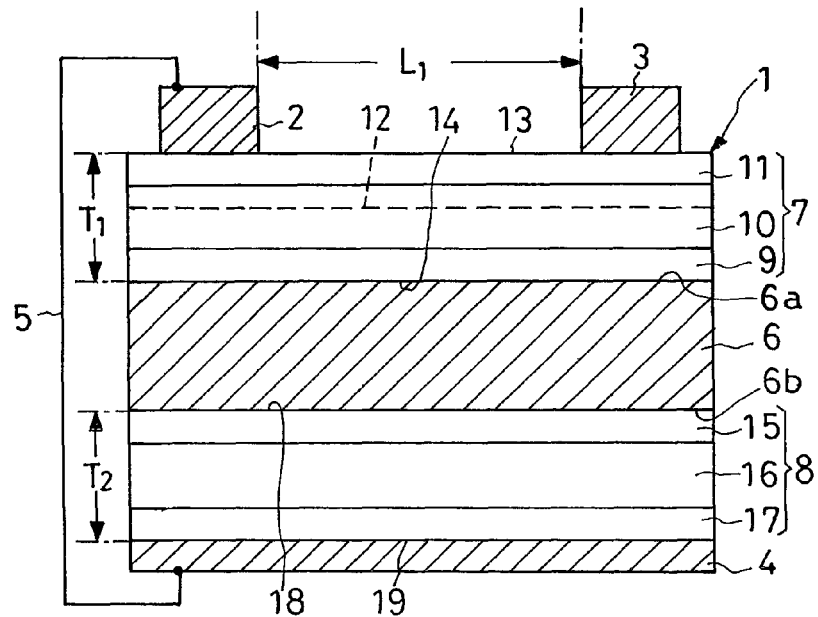
FIG. 1 is a schematic sectional view of an SBD built on the novel principles of the present invention.

The invention will now be described more specifically as embodied in the SBD shown in FIG. 1 of the drawings above. The SBD has a die or chip 1 which has been cut from a semiconductor slice or wafer according to the common practice in the art. The semiconductor wafer is shown in FIG. 2 and therein generally designated 1', to which figure reference will be had after a full description of FIG. 1. The SBD die 1 has two main electrodes, which in this case are an anode 2 as a first main electrode and a cathode 3 as a second main electrode, on its front or top surface, and a back electrode 4 on its back or bottom surface. The anode 2 and back electrode 4 are shown electrically interconnected by a conductor 5.

The SBD die 1 has a flat silicon substrate 6 having a pair of opposite major surfaces $6_a$ and $6_b$. A first or main semiconductor region 7 overlies the major surface $6_a$ of the substrate 6, and a second or counter semiconductor region 8 the other major surface $6_b$ of the substrate 6. Both made from Groups III-V compound semiconductors, the two semiconductor regions 7 and 8 are of practically identical configuration and are disposed, as viewed cross-sectionally as in this figure, in bilateral symmetry with respect to a median plane passing the center of the substrate 6.

The substrate 6 serves both as a basis for epitaxially growing the semiconductor regions 7 and 8 on its opposite major surfaces $6_a$ and $6_b$ and as a mechanical support for these semiconductor regions. It is recommended that the substrate 6 be of p-doped monocrystalline silicon, containing a p-type dopant (e.g. boron) to a concentration ranging from $1 \times 10^{12}$ cm$^{-3}$ to $1 \times 10^{19}$ cm$^{-3}$ and having a resistivity of 0.01-10,000 ohm centimeter. Speaking more broadly, however, the substrate 6 can be of either n-doped or undoped silicon. The thickness of the substrate 6 may range from 100 micrometers to 1500 micrometers.

The main semiconductor region 7 comprises an optional buffer layer 9, an electron transit layer (broadly, first compound semiconductor layer) 10, and an electron supply layer (broadly, second compound semiconductor layer) 11. All these constituent layers 9-11 of the main semiconductor region 7 are grown by epitaxy on the major surface $6_a$ of the substrate 6 in the order in which they were listed above.

The buffer layer 9 may be grown in vapor phase on the substrate 6 by any known or suitable method such as metalorganic chemical vapor deposition (MOCVD) also known as metalorganic vapor phase epitaxy (MOVPE). In practice the buffer layer 9 may be either mono- or multi-layered. The multilayer option may comprise, for example, a desired number of alternations of an aluminum nitride (AlN) sublayer and a gallium nitride (GaN) sublayer. Other Groups III-V compound semiconductor materials are adoptable. Being not too closely associated with the operation of the SBD, however, the buffer layer 9 is eliminable altogether.

Directly overlying the buffer layer 9 is the electron transit layer 10 which is of undoped GaN, grown in vapor phase to a thickness of 0.3-10.0 micrometers in this particular embodiment. As indicated by the broken line labeled 12, the electron transit layer 10 provides, in cooperation with the overlying electron supply layer 11 yet to be detailed, what is known in the art as a two-dimensional electron gas layer as the channel extending parallel to the surface 13 of the main semiconductor region 7. Groups III-V compound semiconductors other than GaN may be adopted for the electron transit layer 10.

The electron supply layer 11 of undoped aluminum gallium nitride (AlGaN) overlies the electron transit layer 10, by being grown in vapor phase thereon to a thickness of 5-50 nanometers. Made from undoped AlGaN, the electron supply layer 11 behaves n-like in the completed device. The composition of the electron supply layer 11 is variable within the limitations of:

where the subscript x is a numeral that is greater than zero and less than one, preferably in the range of 0.2 through 0.4. The most desirable value of x is 0.3. Alternately, the electron supply layer 11 may be made from n-doped AlGaN or from other III-V compound semiconductors.

The AlGaN electron supply layer 11 is wider in band gap than the underlying GaN electron transit layer 10. Thus the piezoelectric depolarization due to the heterojunction of these semiconductor layers 10 and 11 provides the noted two-dimensional electron gas layer 12 in the electron transit layer 10.

The anode 2 is made from a metal or metals chosen for Schottky contact with the surface 13 of the main semiconductor region 7 or of its topmost electron supply layer 11. Preferably, the anode 2 is a lamination of nickel (Ni) and gold (Au) layers, deposited successively in vapor phase on the main semiconductor region surface 13.

Spaced a prescribed distance $L_1$ from the anode 2 is the metal-made cathode 3 which is in ohmic contact with the major surface 13 of the main semiconductor region 7. Preferably, the cathode 3 is a lamination of titanium (Ti) and aluminum (Al) layers, deposited successively in vapor phase on the main semiconductor region surface 13. The cathode 3 need not necessarily be in ohmic contact with the topmost electron supply layer 11 of the main semiconductor region 7 but may be so with the underlying electron transit layer 10. Another possible alternative is to bury the cathode 3 in the electron supply layer 11 and electron transit layer 10 into direct ohmic contact with the two-dimensional electron gas layer 12. As an additional alternative, the cathode 3 may be placed in contact with either the electron transit layer 10 or electron supply layer 10 via a dedicated ohmic contact layer, not shown, as of n-type GaN.

The distance $L_1$ between anode 2 and cathode 3 may be 20 micrometers or so, which is greater than the thickness $T_1$ (e.g., 2.5 micrometers) of the main semiconductor region 7. Both anode 2 and cathode 3 may be comblike in shape as seen from above in FIG. 1.

The counter semiconductor region 8 underlies the silicon substrate 6 as, cross-sectionally, a mirror-image counterpart of the main semiconductor region 7. Thus the counter semiconductor region 8 is a lamination of three counter semiconductor layers 15, 16 and 17 similar respectively to the three constituent layers 9, 10 and 11 of the main semiconductor region 7. The three constituent layers 15, 16 and 17 of the counter semiconductor region 8 are also grown epitaxially in that order on the second major surface $6_b$ of the substrate 6. Functionally, the counter semiconductor region 8 serves for both preventing the wafer 1', FIG. 2, from warpage and improving the voltage strength of the device.

More specifically, the first counter semiconductor layer 15 of the counter semiconductor region 8 is made from the same material, and to approximately the same thickness, as the buffer layer 9 of the main semiconductor region 7. The second counter semiconductor layer 16 of the counter semiconductor region 8 is made from the same material, and to approximately the same thickness, as the electron transit layer 10 of the main semiconductor region 7. The third counter semiconductor layer 17 of the counter semiconductor region 8 is made from the same material, and to approximately the same thickness, as the electron supply layer 11 of the main semiconductor region 7.

The total thickness $T_2$ of the counter semiconductor region 8 is therefore practically equal to the thickness $T_1$ of the main semiconductor region 7 in this particular embodiment. Speaking more broadly, however, for the purpose of warpage prevention, the thickness $T_2$ of the counter semiconductor region 8 should be from 0.2 to 2.0, preferably from 0.5 to 1.5, times the thickness $T_1$ of the main semiconductor region 7. It is most desired, though, that the thicknesses $T_1$ and $T_2$ be the same.

The back electrode 4 is formed on the surface 19, facing away from the substrate 6, of the counter semiconductor region 8. Made from metal, the back electrode 4 is in either ohmic or Schottky contact with the counter semiconductor region 8.

The conductor 5 may be a piece of wire, anchored at one extremity to the anode 2 and at the other to the back electrode 4. Such wire may be coupled to the anode 2 and back electrode 4 via suitable terminals, not shown. As desired or required, the conductor 5 may be held against the sides of the substrate 6, main semiconductor region 7 and counter semiconductor region 8 via an insulating as in one of the embodiments to be disclosed subsequently.

Figure 2:
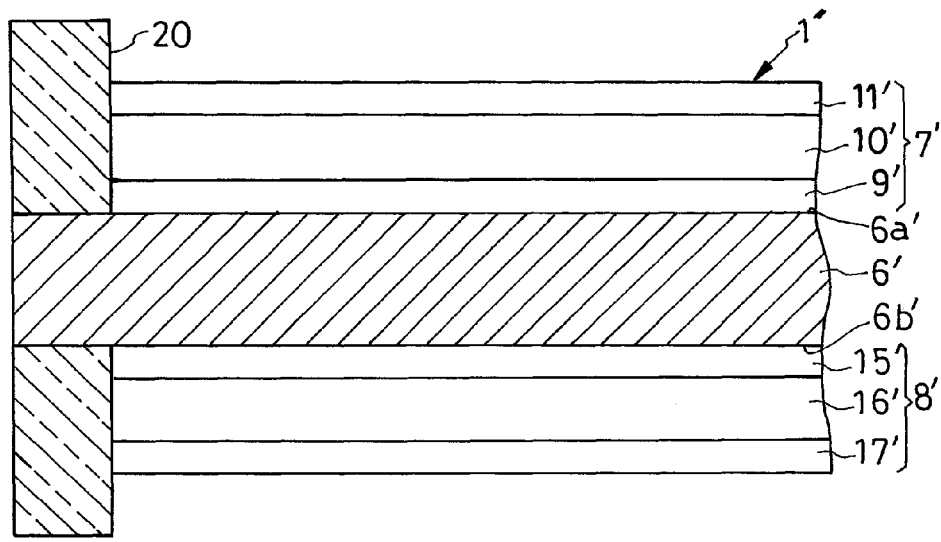
FIG. 2 is a similar illustration of a semiconductor wafer from which is made the SBD of FIG. 1, the semiconductor wafer being shown together with a wafer carrier by which the wafer substrate is held during the concurrent growth of the main semiconductor region and counter semiconductor region on its opposite surfaces.

The reader's attention is now invited to FIG. 2 for an explanation of how a multiplicity of SBD dice 1, each constructed as in FIG. 1, are fabricated using a silicon substrate slice or wafer 6'. The reference numeral "1" is primed in this figure to refer to, instead of the SBD die 1, an SBD wafer including a large main semiconductor region blank 7' and counter semiconductor region blank 8' on both major surfaces $6_a'$ and $6_b'$ of the substrate wafer 6'.

The fabrication of the SBD dice 1 starts with the preparation of the silicon substrate wafer 6' which still has its opposite major surfaces $6_a'$ and $6_b'$ bare. Held edgewise by a wafer carrier 20, the substrate wafer 6' may be placed in an MOVPE reactor for simultaneously growing therein the main semiconductor region blank 7' and counter semiconductor region blank 8' on both surfaces of the substrate wafer. The wafer carrier 20 should be so designed for such concurrent growth of the main semiconductor region blank 7' and counter semiconductor region blank 8' on the substrate wafer 6'.

The main semiconductor region blank 7' may be formed by successively growing a buffer layer blank 9', first compound semiconductor layer blank 10', and second compound semiconductor layer blank 11' on the major surface $6_a'$ of the substrate wafer 6'. The counter semiconductor region blank 8' may likewise be formed by successively growing a buffer layer blank 15', first compound semiconductor layer blank 16', and second compound semiconductor layer blank 17' on the other major surface $6_b'$ of the substrate wafer 6'. The buffer layer blanks 9' and 15' may be grown concurrently on both major surfaces of the substrate wafer 6', then the first compound semiconductor layer blanks 10' and 16' on the buffer layer blanks 9' and 15', and then the second compound semiconductor layer blanks 11' and 17' on the first compound semiconductor layer blanks 10' and 16'.

The substrate wafer 6', buffer layer blanks 9' and 15', first compound semiconductor layer blanks 10' and 16', and second compound semiconductor layer blanks 11' and 17' of the SBD wafer 1' are of course similar in both composition and thickness to their counterparts in the SBD die 1, FIG. 1. The only difference is that the SBD wafer 1' is much larger in surface area than the SBD die 1, so large that the wafer can be diced into a required number of SBD chips. The anode 2, cathode 3 and back electrode 4 may be created on the SBD wafer 1' before dicing the wafer into the individual SBD chips such as that shown in FIG. 1.

In the SBD wafer 1' fabricated as above, a difference in lattice constant and thermal expansion coefficient exists both between substrate wafer 6' and main semiconductor region blank 7' and between substrate wafer 6' and counter semiconductor region blank 8'. The stresses due to these differences counterbalance each other, being oriented in opposite directions, and so save the SBD wafer 1' from warpage. Warpage-free wafers are easier of handling, permit more precise, correct mounting to manufacturing equipment, and make possible a more accurate placement of the anodes 2 and cathodes 3 in creating the same as by photolithography.

In operation, when the anode 2 is higher in potential than the cathode 3, a forward current fill flow along the path sequentially comprising the anode 2, electron supply layer 11, two-dimensional electron gas layer 12, electron supply layer 11 again, and cathode 3. The electron supply layer 11 is thinner than the electron transit layer 10, so much so that its electric resistance is negligibly small in its thickness direction compared to that in its transverse direction (parallel to the surface 13). Consequently, upon voltage application between anode 2 and cathode 3, the current does not practically flow transversely through the electron supply layer 11 but does flow in its thickness direction.

When the anode 2 becomes less in potential than the cathode 3, the Schottky barrier between anode 2 and main semiconductor region 7 will be reverse biased, resulting in the creation of a depletion layer in the main semiconductor region. The depletion layer will block the current path between anode 2 and cathode 3 thereby turning the SBD off.

Were it not for the back electrode 4, the potential of the substrate 6 would fluctuate with changes in voltage between anode 2 and cathode 3, causing fluctuations in the performance of the SBD. Little or no such fluctuations of the substrate potential will occur by providing the back electrode 4 and compulsorily holding the same at the anode potential.

When the SBD is turned off, there will be impressed between cathode 3 and back electrode 4 a voltage that will be as high as that between anode 2 and cathode 3. Let us assume that the SBD had no counter semiconductor region 8 proposed by the instant invention, with the back electrode 4 formed directly on the major surface $6_b$ of the substrate 6 as in the prior art. The combination of the substrate 6 and main semiconductor region 7 thereon would then be subjected to the same voltage as that between anode 2 and cathode 3. Generally, the greater the thickness $T_1$ of the main semiconductor region 7, the higher will be its resistance in its thickness direction, the less will be the amount of current leakage in that direction, and so the better will be the assessment of the SBD in voltage-withstanding capability. As has been stated in connection with the prior art, however, the main semiconductor region 7 cannot possibly be made thicker than five micrometers or so in order to avoid the risk of its cracking and of the wafer warping. For this reason the prior art SBD with the back electrode formed directly on its underside was unsatisfactory in voltage strength.

By contrast, incorporating the counter semiconductor region 8 between substrate 6 and back electrode 4, the SBD of this invention has a materially less voltage applied across the substrate 6 and main semiconductor region 7 than heretofore. The result is a less leakage current, and higher voltage strength, in the thickness direction. Furthermore, because the counter semiconductor region 8 is of the same configuration, compositions, and thickness as the main semiconductor region 7, the current leakage in the thickness direction of the SBD according to the invention is approximately half that of the prior art device; in other words, the SBD according to the invention is approximately twice as high as the prior art in voltage strength in is thickness direction.

The above strength of the invention may be restated that, for the same voltage strength, the SBD according to the invention may have its main semiconductor region 7 only half as thick as the corresponding part of the prior art device. Such a thin main semiconductor region is far less likely to develop cracks.

The advantages gained by this embodiment of the invention may be recapitulated as follows:
1. The SBD die 1 or wafer 1' is made warp-free by creating the main semiconductor region 7, or blank 7', and counter semiconductor region 8, or blank 8', on the pair of opposite major surfaces of the substrate 6 or substrate wafer 6' in mirror-image relationship to each other.
2. The SBD is improved in voltage strength by virtue of the counter semiconductor region 8 even though its back electrode 4 has a potential fixed to that of the anode 2 for reliable electrical performance.
3. Current leakage in both transverse and thickness directions is reduced by the pn junction between the p-type silicon substrate 6 and the n-like buffer layer 9 and electron transit layer 10.

Figure 3:
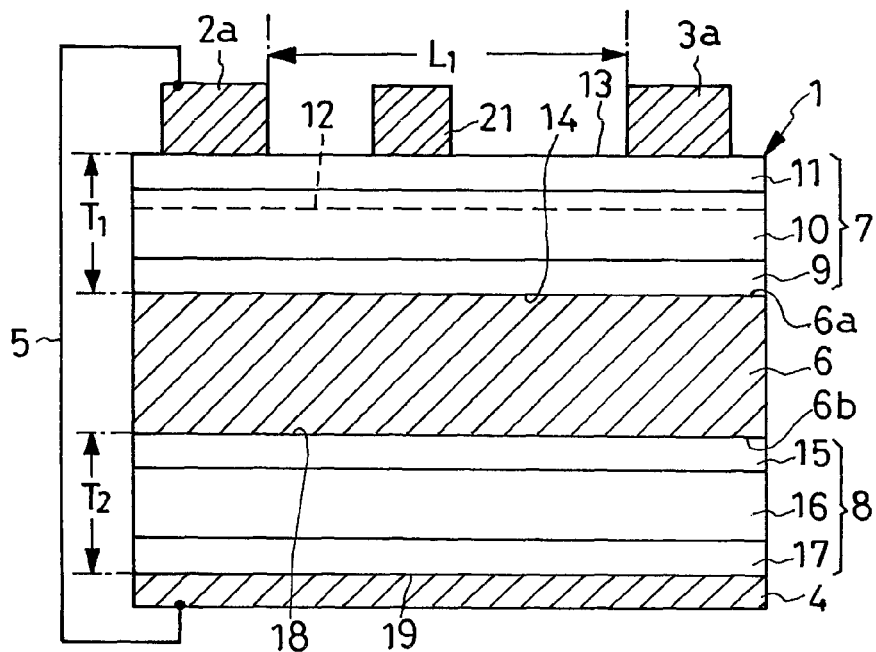
FIG. 3 is a view similar to FIG. 1 but showing a HEMT built on the novel principles of the invention.

Embodiment of FIG. 3

The invention is here shown applied to a HEMT. Made from the die 1 of the same design as the SBD die 1 of FIG. 1, the HEMT differs from the SBD in having a source $2_a$ as a first main electrode and drain $3_a$ as a second main electrode in places of the anode 2 and cathode 3 of the SBD and in additionally having a gate or gate electrode 21 between source and drain.

The source $2_a$ and drain $3_a$ are both in ohmic contact with the surface 13 of the main semiconductor region 7. Like the cathode 3 of the FIG. 1 embodiment, the source $2_a$ and drain $3_a$ may both be laminations of titanium (Ti) and aluminum (Al) layers. The gate 21 on the other hand is in Schottky contact with the main semiconductor region surface 13 and, like the anode 2 of the FIG. 1 embodiment, may be a lamination of nickel and gold layers. The back electrode 4 is coupled to the anode $2_a$ via the conductor 5.

The HEMT die 1 being of the same construction as the SBD die 1 of FIG. 1, the two-dimensional electron gas layer 12 will appear in the electron transit layer 10 of the main semiconductor region 7. Therefore, when the HEMT is on, a flow of electrons will occur along the path sequentially comprising the source $2_a$, electron supply layer 11, two-dimensional electron gas layer 12, electron supply layer 11, and drain 3. This HEMT is normally on, so that an application of a turn-off voltage between gate 21 and source $2_a$ will result in the reverse biasing of the Schottky junction between mains semiconductor region 7 and gate 21 and hence in the creation of a depletion layer in the main semiconductor region 7. The depletion layer will block the two-dimensional electron gas layer 12, turning the HEMT off.

The voltage between source $2_a$ and drain $3_a$ and that between drain $3_a$ and back electrode 4 are both higher when the HEMT is off than when it is on. Current leakage will therefore occur both laterally and cross-sectionally of the device when it is off. However, as in the case of the FIG. 1 SBD, the HEMT will have less cross-sectional current leakage by virtue of the counter semiconductor region 8 than in the absence of this region. The HEMT is also similar to the FIG. 1 SBD in the reliability of operation thanks to the back electrode 4 having its potential fixed to that of the source $2_a$.

Figure 4:
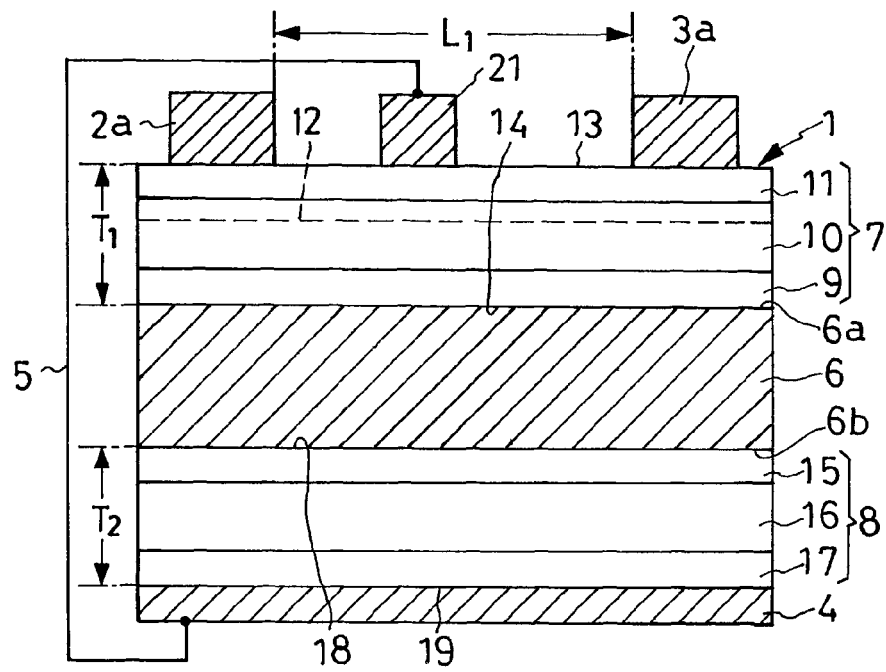
FIG. 4 is also a view similar to FIG. 1 but showing another preferred form of HEMT according to the invention.

Embodiment of FIG. 4

Another preferred form of HEMT shown in this figure has its back electrode 4 coupled to the gate 21 via the conductor 5 but is otherwise identical with its FIG. 3 counterpart. This HEMT also has its operation just as stabilized as in the FIGS. 1 and 3 embodiments by having its back electrode potential fixed to that of the gate 21.

Figure 5:
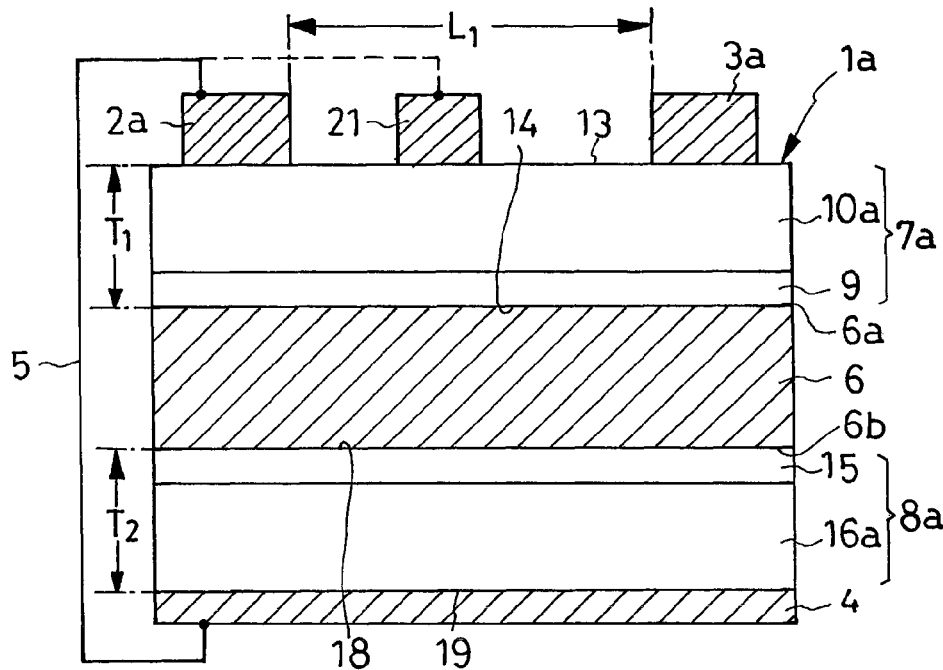
FIG. 5 is also a view similar to FIG. 1 but showing a MESFET built on the novel principles of the invention.

Embodiment of FIG. 5

This embodiment represents an application of the instant invention to a MESFET, which is similar in construction to the FIG. 3 HEMT except for the configuration of its die $1_a$. The MESFET die $1_a$ has a main semiconductor region $7_a$ and counter semiconductor region $8_a$ on the opposite major surfaces $6_a$ and $6_b$ of the silicon substrate 6 in mirror-image relationship to each other. The main semiconductor region $7_a$ is a lamination of the buffer layer 9 and a compound semiconductor layer $10_a$. Directly overlying the substrate 6, the buffer layer 9 is of the same composition as that of the buffer regions 9 of the foregoing embodiments. The compound semiconductor layer $10_a$ is made from n-type GaN.

The counter semiconductor region $8_a$ is a lamination of a compound semiconductor layer 15 directly underlying the substrate 6, and another compound semiconductor layer $16_a$. The compound semiconductor layer 15 is of the same composition as the buffer layer 9 of the main semiconductor region 7, and the other compound semiconductor layer $16_a$ is of the same composition as the compound semiconductor layer $10_a$ of the main semiconductor region.

As has been stated in conjunction with the main and counter semiconductor regions 7 and 8 of the FIG. 1 embodiment, the layers 9 and 15, and the layers $10_a$ and $16_a$, of the semiconductor regions $7_a$ and $8_a$ are epitaxially grown at the same time on both sides of the substrate 6. The layers 9 and 15 and the layers $10_a$ and $16_a$ are therefore of the same compositions and same thicknesses.

The back electrode 4 is shown connected to the source $2_a$ as in the FIG. 3 HEMT by way of the solid-line conductor 5. Alternatively, however, it might be connected to the gate 21, as indicated by the broken line.

When the MESFET is turned on, an electron current flows sequentially through the source $2_a$, compound semiconductor layer $10_a$ of the main semiconductor region $7_a$, and drain $3_a$. Upon application of a turn-off voltage between gate 21 and source $2_a$, the Schottky junction between the gate 21 and the compound semiconductor layer $10_a$ of the main semiconductor region $7_a$ is reverse biased. A depletion layer created as a result in the compound semiconductor layer $10_a$ interrupts the electron flow.

The counter semiconductor region $8_a$ of the MESFET performs the same functions as that designated 8 in the embodiments of FIGS. 1, 3 and 4.

Figure 6:
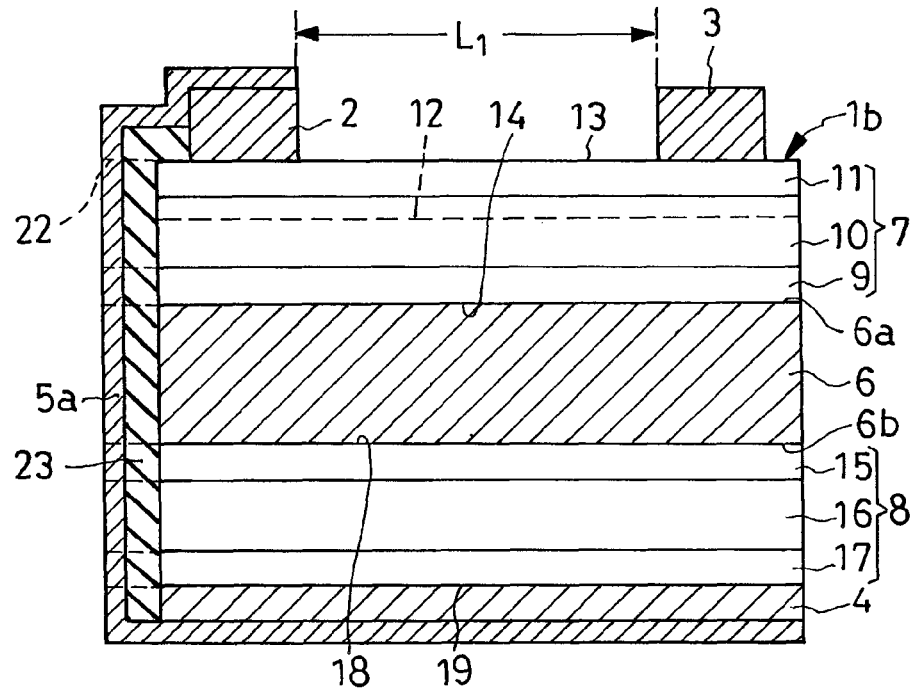
FIG. 6 is a also a view similar to FIG. 1 but showing another preferred form of SBD according to the invention.
Figure 7:
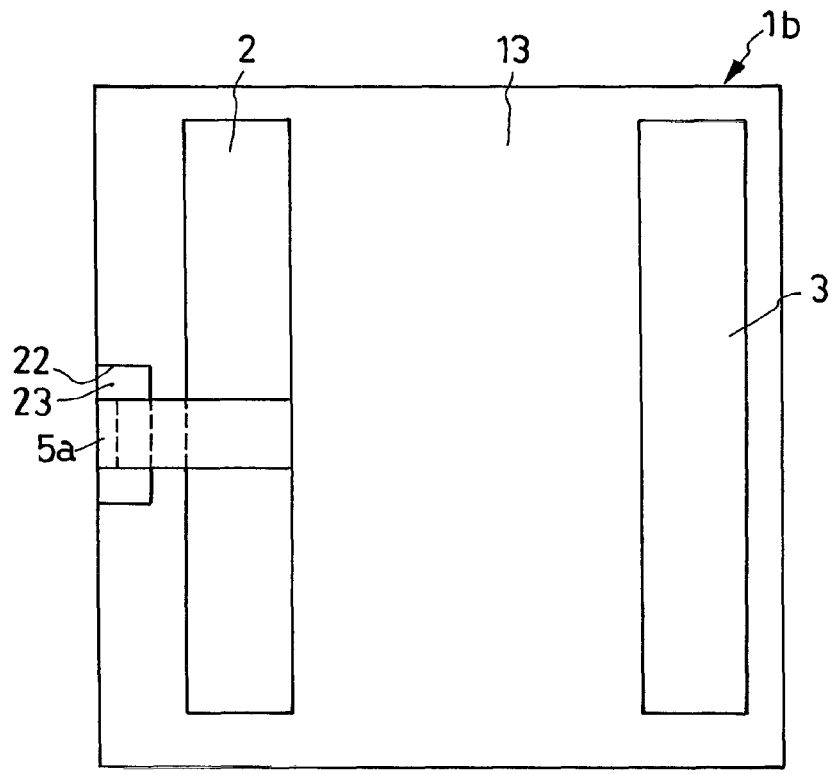
FIG. 7 is a top plan view of the SBD of FIG. 6.

Embodiment of FIGS. 6-7

The SBD die $1_b$ shown in these figures differs from the SBD die 1 of FIG. 1 in having a trench 22 formed in one side so as to extend between its pair of opposite surfaces 13 and 19. The trench 22 receives a filling 23 of electrically insulating material. Embedded in this insulating filling 23 is a conductor $5_a$ electrically connecting the back electrode 4 to the anode 2. The SBD of this embodiment is akin to its FIG. 1 counterpart in all the other details of construction.

Electrically, too, this SBD is equivalent to that of FIG. 1, gaining the same benefits as does the latter. Additionally, as the connecting conductor $5_a$ is inconspicuously embedded in the die $1_b$, the SBD is easier of handling and more stable mechanically.

As an obvious alternative to the teachings of this embodiment, the connecting conductor may be received, via an insulator, in a hole extending through the SBD die. The embodiments of FIGS. 3-5 are likewise modifiable as taught by this embodiment.

Figure 8:
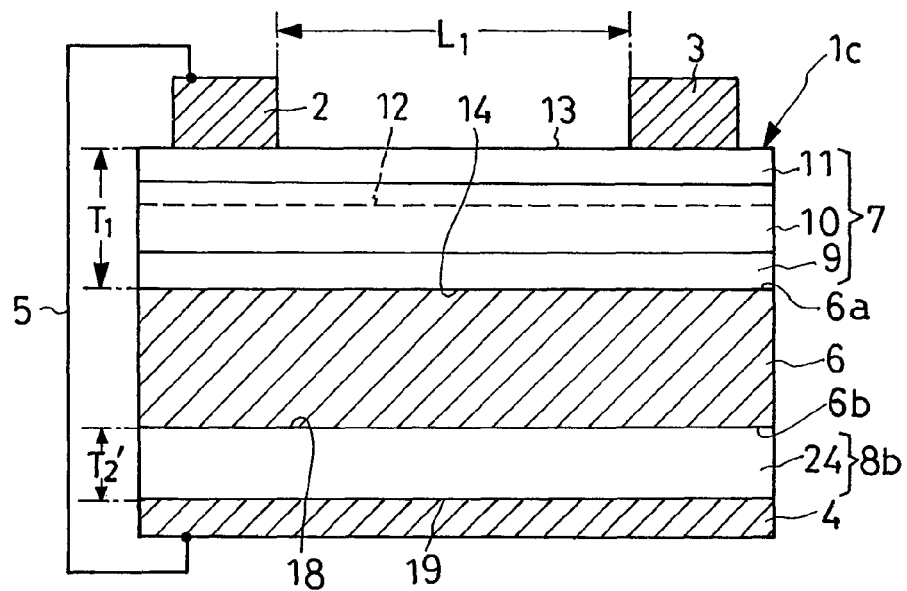
FIG. 8 is a view similar to FIG. 1 but showing still another preferred form of SBD according to the invention.

Embodiment of FIG. 8

The SBD seen in FIG. 8 has a die $1_c$ which features a monolayered counter semiconductor region $8_b$ but is otherwise identical with the FIG. 1 SBD. The counter semiconductor region $8_b$ has but one compound semiconductor layer 24 of indefinite thickness $T_2'$. The compound semiconductor layer 24 may be of GaN.

This embodiment differs from all the preceding ones in that it presupposes successive, not concurrent, growth of the main semiconductor region 7 and counter semiconductor region $8_b$ on the substrate 6. For instance, the main semiconductor region 7 with its three constituent layers 9-11 may first be grown on the major surface $6_a$ of the substrate 6, followed by the growth of the monolayered counter semiconductor region $8_b$ on the other major surface $6_b$ of the substrate. This order is reversible.

Speaking more broadly, the counter semiconductor region $8_b$ need not be of GaN or of any particular composition but may be of the same composition as any of the three constituent layers 15-17 of the counter semiconductor region 8 of the foregoing embodiments. Or the counter semiconductor region $8_b$ may have two layers similar to any two selected ones of the constituent layers 9-11 of the main semiconductor region 7.

As the main semiconductor region 7 and counter semiconductor region $8_b$ are fabricated one after the other as above, the thickness $T_2'$ of the counter semiconductor region $8_b$ may be made either greater or less than, or equal to, the thickness $T_1$ of the main semiconductor region 7. To make the counter semiconductor region $8_b$ thinner than the main semiconductor region 7 is conducive to the curtailment of the time required for its growth but not to the prevention of wafer warpage and the improvement of voltage strength. Experiment has proved, however, that such a thinner counter semiconductor region offers better results in both wafer warpage prevention and voltage strength improvement than in the absence of that region itself. Irrespective of its thickness relative to that of the main semiconductor region 7, the monolayered counter semiconductor region $8_b$ makes the fabrication of the device easier.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. Contact layers could be formed under the cathode 3 for better ohmic contact with the main semiconductor region 7 in the FIGS. 1, 6 and 8 embodiments, and under the source $2_a$ and drain $3_a$ for better ohmic contact with the main semiconductor region 7 or $7_a$ in the FIGS. 3-5 embodiments.
2. The cathode 3, source $2_a$ and drain $3_a$ might be placed in direct contact with the compound semiconductor layer 10, or with the two-dimensional electron gas layer 12, of the main semiconductor region 7 by being buried therein.
3. The constituent layers of the main and counter semiconductor regions of the various embodiments may be made from Groups III-V compound semiconductors other than GaN and AlGaN, such as InGaN, AlInGaN, AlN, InAlN, AlP, GaP, AlInP, GaInP, AlGaP, AlGaAs, GaAs, AlAs, InAs, InP, InN and GaAsP.
4. The substrate 1 may be made from SiC or other silicon compounds rather than from silicon.
5. The second compound semiconductor layer 11 of the main semiconductor region 7 could be a hole supply layer of a p-type semiconductor instead of the exemplified electron supply layer. A two-dimensional hole gas layer would then appear instead of the two-dimensional electron gas layer 12.
6. The SBDs of FIGS. 1, 6 and 8, the HEMTs of FIGS. 3 and 4, and the MESFET of FIG. 5 may be integrated with some other semiconductor device. For instance, a Schottky electrode may be provided between gate 21 and drain $3_a$, or outwardly of the drain $3_a$, and electrically coupled to the source $2_a$ in the HEMTs of FIGS. 3 and 4 or in the MESFET of FIG. 5.
7. Another SBD, FET or like semiconductor device may be made using the counter semiconductor region 8, $8_a$ or $8_b$.

8. The embodiments of FIGS. 3-5 may be turned into insulated-gate FETs by providing a gate insulator under the gate 21.
9. The back electrode 4 could be connected to any suitable point of a fixed potential or to a power supply rather than to the anode 2, source 2$_a$ or gate 21 as in the illustrated embodiments.

What is claimed is:

1. A semiconductor device comprising:
   a substrate made from material comprising silicon, the substrate having a pair of opposite major surfaces;
   a main semiconductor region of Groups III-V compound semiconductor material formed on one major surface of the substrate, the main semiconductor region being configured to provide a desired semiconductor device;
   a counter semiconductor region of Groups III-V compound semiconductor material formed on the other major surface of the substrate, the counter semiconductor region being formed in a mirror-image counterpart of the main semiconductor region;
   at least two main electrodes on the main semiconductor region;
   a back electrode on the counter semiconductor region; and
   a conductor electrically connecting the back electrode to one of the two main electrodes.

2. A semiconductor device as defined in claim 1, wherein the conductor is received via an insulator in a trench formed in the substrate and the main and the counter semiconductor region.

3. A field-effect semiconductor device comprising:
   a substrate made from material comprising silicon, the substrate having a pair of opposite major surfaces;
   a main semiconductor region of Groups III-V compound semiconductor material formed on one major surface of the substrate;
   a counter semiconductor region of Groups III-V compound semiconductor material formed on the other major surface of the substrate, the counter semiconductor region being formed in a mirror-image counterpart of the main semiconductor region;
   a first main electrode, a second main electrode, and a gate electrode on the main semiconductor region;
   a back electrode on the counter semiconductor region; and
   a conductor electrically connecting the back electrode to the first main electrode.

4. A field-effect semiconductor device as defined in claim 3, wherein at least the main semiconductor region is a lamination of at least two compound semiconductor layers of different compositions.

5. A field-effect semiconductor device as defined in claim 3, wherein the main semiconductor region is in the form of a single layer of a prescribed conductivity type.

6. A field-effect semiconductor device comprising:
   a substrate made from material comprising silicon, the substrate having a pair of opposite major surfaces;
   a main semiconductor region of Groups III-V compound semiconductor material formed on one major surface of the substrate;
   a counter semiconductor region of Groups III-V compound semiconductor material formed on the other major surface of the substrate, the counter semiconductor region being formed in a mirror-image counterpart of the main semiconductor region;
   a first main electrode, a second main electrode and a gate electrode on the main semiconductor region;
   a back electrode on the counter semiconductor region; and
   a conductor electrically connecting the back electrode to the gate electrode.

* * * * *